US011239437B2

(12) United States Patent
Jang et al.

(10) Patent No.: US 11,239,437 B2
(45) Date of Patent: Feb. 1, 2022

(54) PHOTOACTIVE LAYER AND ORGANIC SOLAR CELL INCLUDING SAME (71) Applicant: LG CHEM, LTD., Seoul (KR)

(72) Inventors: Songrim Jang, Daejeon (KR); Kyungkon Kim, Seoul (KR); Jinseck Kim, Daejeon (KR); Doowhan Choi, Daejeon (KR); Bogyu Lim, Daejeon (KR); Kyuwan Cho, Seoul (KR)

(73) Assignee: LG CHEM, LTD., Seoul (KR)

( * ) Notice: Subject to any disclaimer, the term of this patent is extended or adjusted under 35 U.S.C. 154(b) by 196 days.

(21) Appl. No.: 16/478,364

(22) PCT Filed: Apr. 13, 2018

(86) PCT No.: PCT/KR2018/004318
§ 371 (c)(1),
(2) Date: Jul. 16, 2019

(87) PCT Pub. No.: WO2018/208021
PCT Pub. Date: Nov. 15, 2018

(65) Prior Publication Data
US 2019/0372039 A1 Dec. 5, 2019

(30) Foreign Application Priority Data

May 11, 2017 (KR) .................. 10-2017-0058710
Apr. 12, 2018 (KR) .................. 10-2018-0042648

(51) Int. Cl.
*H01L 51/42* (2006.01)
*C08G 61/12* (2006.01)
*H01L 51/00* (2006.01)

(52) U.S. Cl.
CPC .......... *H01L 51/424* (2013.01); *C08G 61/126* (2013.01); *H01L 51/0036* (2013.01);
(Continued)

(58) Field of Classification Search
CPC .................. H01L 51/424; H01L 51/4253; H01L 51/4273
See application file for complete search history.

(56) References Cited

U.S. PATENT DOCUMENTS

2010/0224252 A1 9/2010 Scharber et al.
2016/0111670 A1 4/2016 Lee et al.
(Continued)

FOREIGN PATENT DOCUMENTS

JP 2012513108 6/2010
JP 2012519964 8/2012
(Continued)

OTHER PUBLICATIONS

Zhang, L. et al, Poly(3-butylthiophene) Inducing Crystallization of Small Molecule Donor for Enhanced Photovoltaic Performance, The Journal of Physical Chemistry C, 2015, vol. 119, No. 41, 23310-23318, pp. 1-31.
Bi et al, An Obvious Improvement in the Performance of Ternary Organic Solar Cells with "Guest" Donor Present at the "Host" Donor/Acceptor Interface, ACS Applied Materials & Interfaces, 2016, vol. 8, No. 25, 23212-23221, pp. 1-28.
(Continued)

*Primary Examiner* — Lindsey A Bernier
(74) *Attorney, Agent, or Firm* — Myers Bigel, P.A.

(57) ABSTRACT

The present specification provides a photoactive layer including: an electron donor; and an electron acceptor, in which the electron donor includes: a single molecular material; and a polymer material, a content of the electron donor is higher than a content of the electron acceptor, and in the electron donor, a content of the single molecular material is higher than a content of the polymer material, and an organic solar cell including the same.

17 Claims, 4 Drawing Sheets (52) U.S. Cl.
CPC ...... *H01L 51/4253* (2013.01); *H01L 51/4273* (2013.01); *C08G 2261/3223* (2013.01); *C08G 2261/3241* (2013.01); *C08G 2261/3246* (2013.01)

(56) References Cited

U.S. PATENT DOCUMENTS

| 2016/0181536 | A1 |   | 6/2016 | Kim et al. |            |
|--------------|----|---|--------|------------|------------|
| 2016/0272656 | A1 | * | 9/2016 | Cho        | H01L 51/0068 |

FOREIGN PATENT DOCUMENTS

| JP | 2016521920       |   | 7/2016  |             |
|----|------------------|---|---------|-------------|
| KR | 20100044865      |   | 4/2010  |             |
| KR | 20100090874      |   | 8/2010  |             |
| KR | 20120044527      |   | 5/2012  |             |
| KR | 20140132273      |   | 11/2014 |             |
| KR | 20150015413      |   | 2/2015  |             |
| WO | WO-2015016626 A1 | * | 2/2015  | C08G 75/32  |
| WO | WO-2015064937 A2 | * | 5/2015  | H01L 51/0053 |

OTHER PUBLICATIONS

Zhang, J. et al, Conjugated Polymer-Small Molecule Alloy Leads to High Efficient Ternary Organic Solar Cells, Journal of the American Chemical Society, 2015, vol. 137, pp. 8176-8183.
C.W. Tang, Two-layer organic photovoltaic cell, Applied Physics Letters, vol. 48, No. 2, 1986, pp. 183-185.
Yu et al, Polymer Photovoltaic Cells: Enhanced Efficiencies via a Network of Internal Donor-Acceptor Heterojunctions, Science, vol. 270, 1995, pp. 1789-1791.
International Search Report of the International Searching Authority corresponding to International Patent Application No. PCT/KR2018/004318, dated Jul. 30, 2019, (7 pages with English translation).
Cho et al, Reducing Trap-Assisted Recombination in Small Organic Molecule-Based Photovoltaics by the Addition of a Conjugated Block Copolymer, Macromolecular Rapid Communications, 2017,vol. 39, pp. 1-6.
Extended European Search Report corresponding to EP 18798747.4, dated Jan. 28, 2020 (6 pages).
Zhang et al. "Supporting Information: Poly(3-butylthiophene) Inducing Crystallization of Small Molecule Donor for Enhanced Photovoltaic Performance" Journal of Physical Chemistry C, 2015 (13 pages).

* cited by examiner

PHOTOACTIVE LAYER AND ORGANIC SOLAR CELL INCLUDING SAME

CROSS REFERENCE TO RELATED APPLICATIONS

This application is a 35 U.S.C. § 371 national stage application of PCT International Application No. PCT/KR2018/004318, filed Apr. 13, 2018, which claims priority from Korean Patent Application Nos. 10-2017-0058710 and 10-2018-0042648, filed May 11, 2017 and Apr. 12, 2018, respectively, the contents of which are incorporated herein in their entireties by reference. The above-referenced PCT International Application was published in the Korean language as International Publication No. WO 2018/208021 A1 on Nov. 15, 2018.

TECHNICAL FIELD

The present specification relates to a photoactive layer and an organic solar cell including the same.

BACKGROUND ART

An organic solar cell is a device which may directly convert solar energy into electric energy by applying a photovoltaic effect. A solar cell may be divided into an inorganic solar cell and an organic solar cell, depending on the materials constituting a thin film. Typical solar cells are made through a p-n junction by doping crystalline silicon (Si), which is an inorganic semiconductor. Electrons and holes generated by absorbing light diffuse to p-n junction points and move to an electrode while being accelerated by the electric field. The power conversion efficiency in this process is defined as the ratio of electric power given to an external circuit and solar power entering the solar cell, and the efficiency have reached approximately 24% when measured under a currently standardized virtual solar irradiation condition. However, since inorganic solar cells in the related art have already shown the limitation in economic feasibility and material demands and supplies, an organic semiconductor solar cell, which is easily processed and inexpensive and has various functionalities, has come into the spotlight as a long-term alternative energy source.

For the solar cell, it is important to increase efficiency so as to output as much electric energy as possible from solar energy. In order to increase the efficiency of the solar cell, it is important to generate as many excitons as possible inside a semiconductor, but it is also important to pull the generated charges to the outside without loss. One of the reasons for the charge loss is the dissipation of generated electrons and holes due to recombination. Various methods have been proposed to deliver generated electrons and holes to an electrode without loss, but additional processes are required in most cases, and accordingly, manufacturing costs may be increased.

DETAILED DESCRIPTION OF THE INVENTION

Technical Problem

The present specification provides a photoactive layer and an organic solar cell including the same.

Technical Solution

An exemplary embodiment of the present specification provides a photoactive layer comprising: an electron donor; and an electron acceptor, in which the electron donor includes: a single molecular material; and a polymer material, a content of the electron donor is higher than a content of the electron acceptor, and in the electron donor, a content of the single molecular material is higher than a content of the polymer material.

Another exemplary embodiment of the present specification provides an organic solar cell including: a first electrode; a second electrode provided to face the first electrode; and an organic material layer having one or more layers provided between the first electrode and the second electrode and including the photoactive layer.

Advantageous Effects

An organic solar cell according to an exemplary embodiment of the present specification may exhibit excellent characteristics in terms of efficiency, stability, processability, and the like by simultaneously using a single molecular material having reproducibility and a simple process and a polymer material having excellent efficiency as an electron donor of a photoactive layer.

101: Substrate
102: First electrode
103: Hole transport layer
104: Photoactive layer
105: Second electrode

BEST MODE

Hereinafter, the present specification will be described in detail.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

In the present specification, the "structure in the parenthesis" means a structure included in the ( ).

In the present specification, the "unit" means a repeated structure included in a monomer of a copolymer, and a structure in which the monomer is bonded into the copolymer by polymerization.

In the present specification, the meaning of "including a unit" means that the unit is included in a main chain in a polymer.

An exemplary embodiment of the present specification provides a photoactive layer including: an electron donor; and an electron acceptor, in which the electron donor includes: a single molecular material; and a polymer material, a content of the electron donor is higher than a content of the electron acceptor, and in the electron donor, a content of the single molecular material is higher than a content of the polymer material.

In an exemplary embodiment of the present specification, when the content of the electron donor is higher than that of the electron acceptor, there is an effect in that the efficiency is increased.

In an exemplary embodiment of the present specification, in the electron donor, when the content of the single molecular material is higher than the content of the polymer material, there is an effect in that the efficiency is increased.

In an exemplary embodiment of the present specification, the difference in content may mean a difference in weight.

In the present specification, the "polymer" means a material in which the same structure is repeated. That is, the "polymer" means a material in which a repeating unit is present.

In an exemplary embodiment of the present specification, the polymer material has a number average molecular weight of 2,000 g/mol to 30,000,000 g/mol. Specifically, the polymer material has a number average molecular weight of 10,000 g/mol to 3,000,000 g/mol. More specifically, the polymer material has a number average molecular weight of 10,000 g/mol to 100,000 g/mol.

In the present specification, the "single molecule" means a material composed of one structure having no repeating unit.

In an exemplary embodiment of the present specification, the single molecular material has a molecular weight of 1,000 g/mol to 10,000,000 g/mol. Specifically, the single molecular material has a molecular weight of 1,000 g/mol to 9,000 g/mol.

In an exemplary embodiment of the present specification, a weight ratio of the electron donor to the electron acceptor may be 10:1 to 1.1:1. More specifically, a weight ratio of the electron donor to the electron acceptor may be 5:1 to 1.1:1.

When the weight ratio of the electron donor to the electron acceptor satisfies the above range, there is an effect in that the efficiency and the stability are increased.

In an exemplary embodiment of the present specification, the content of the single molecular material in the electron donor is higher than that of the polymer material in the electron donor. Specifically, in an exemplary embodiment of the present specification, a weight ratio of the single molecular material to the polymer material in the electron donor is 30:1 to 2:1. More specifically, a weight ratio of the single molecular material to the polymer material in the electron donor is 20:1 to 5:1. When the weight ratio of the single molecular material to the polymer material satisfies the above range, there is an effect in that the efficiency is increased.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; a nitro group; an imide group; an amide group; a carbonyl group; an ester group; a hydroxyl group; an alkyl group; a cycloalkyl group; an alkoxy group; an aryloxy group; an alkylthioxy group; an arylthioxy group; an alkylsulfoxy group; an arylsulfoxy group; an alkenyl group; a silyl group; a siloxane group; a boron group; an amine group; an arylphosphine group; a phosphine oxide group; an aryl group; and a heterocyclic group, or being substituted with a substituent to which two or more substituents among the exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

In the present specification, a halogen group may be fluorine, chlorine, bromine or iodine.

In the present specification, the number of carbon atoms of an imide group is not particularly limited, but is preferably 1 to 30.

In the present specification, for an amide group, the nitrogen of the amide group may be substituted with hydrogen, a straight-chained, branched, or cyclic alkyl group having 1 to 30 carbon atoms, or an aryl group having 6 to 30 carbon atoms.

In the present specification, the number of carbon atoms of a carbonyl group is not particularly limited, but is preferably 1 to 30.

In the present specification, for an ester group, the oxygen of the ester group may be substituted with a straight-chained, branched, or cyclic alkyl group having 1 to 25 carbon atoms, or an aryl group having 6 to 30 carbon atoms.

In the present specification, the alkyl group may be straight-chained or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl, and the like, but are not limited thereto.

In the present specification, a cycloalkyl group is not particularly limited, but has preferably 3 to 30 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight-chained, branched, or cyclic. The number of carbon atoms of the alkoxy group is not particularly limited, but is preferably 1 to 30. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, an amine group may be selected from the group consisting of —NH$_2$; an alkylamine group; an N-arylalkylamine group; an arylamine group; an N-arylheteroarylamine group; an N-alkylheteroarylamine group; and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, and the like, but are not limited thereto.

In the present specification, an N-alkylarylamine group means an amine group in which a N of the amine group are substituted with an alkyl group and an aryl group.

In the present specification, an N-arylheteroarylamine group means an amine group in which a N of the amine group are substituted with an aryl group and a heteroaryl group.

In the present specification, an N-alkylheteroarylamine group means an amine group in which a N of the amine group are substituted with alkyl group and a heteroaryl group.

In the present specification, the alkyl group in the alkylamine group, the N-arylalkylamine group, the alkylthioxy group, the alkylsulfoxy group, and the N-alkylheteroarylamine group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include an methylsulfoxy group, an ethylsulfoxy group, a propylsulfoxy group, a butylsulfoxy group, and the like, but the examples are not limited thereto.

In the present specification, the alkenyl group may be straight-chained or branched, and the number of carbon atoms thereof is not particularly limited, but is preferably 2 to 30. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, specific examples of a silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a boron group may be —BR$_{100}$R$_{200}$, and R$_{100}$ and R$_{200}$ are the same as or different from each other, and may be each independently selected from the group consisting of hydrogen; deuterium; halogen; a nitrile group; a substituted or unsubstituted monocyclic or polycyclic cycloalkyl group having 3 to 30 carbon atoms; a substituted or unsubstituted straight-chained or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, specific examples of a phosphine oxide group include a diphenylphosphine oxide group, dinaphthylphosphine oxide, and the like, but are not limited thereto.

In the present specification, an aryl group may be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the fluorenyl group may be and the like. However, the fluorenyl group is not limited thereto.

In the present specification, the aryl group in the aryloxy group, the arylthioxy group, the arylsulfoxy group, the N-arylalkylamine group, the N-arylheteroarylamine group, and the arylphosphine group is the same as the above-described examples of the aryl group. Specifically, examples of the aryloxy group include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, examples of the arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include a monocyclic aryl group, a polycyclic aryl group, or both a monocyclic aryl group and a polycyclic aryl group. For example, the aryl group in the arylamine group may be selected from the above-described examples of the aryl group.

In the present specification, a heterocyclic group includes one or more atoms other than carbon, that is, one or more heteroatoms, and specifically, the heteroatom may include one or more atoms selected from the group consisting of O, N, Se, S, and the like. The number of carbon atoms thereof is not particularly limited, but is preferably 2 to 30, and the heterocyclic group may be monocyclic or polycyclic. Examples of the heterocyclic group include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group (phenanthroline), a thiazolyl group, an isoxazolyl group, an oxadiazolyl group, a thiadiazolyl group, a phenothiazinyl group, a dibenzofuranyl group, and the like, but are not limited thereto.

In the present specification, examples of the heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups may include a monocyclic heteroaryl group, a polycyclic heteroaryl group, or both a monocyclic heteroaryl group and a polycyclic heteroaryl group. For example, the heteroaryl group in the heteroarylamine group may be selected from the above-described examples of the heterocyclic group.

In an exemplary embodiment of the present specification, the electron acceptor includes a fullerene derivative.

In the present specification, the "fullerene derivative" means a material having one or more spherical shell structures in which a molecule is formed of carbon. Examples thereof include: a fullerene as a molecule having a spherical shell shape; a fullerene derivative having an inorganic group or an organic group, which is bonded to a fullerene comprising carbon; a fullerene derivative to which a spherical shell structure constituting a fullerene or the fullerene derivative is bonded directly or through one or more elements; and the like.

In an exemplary embodiment of the present specification, the fullerene means a molecule in which a carbon atom is linked in the form of a soccer ball composed of pentagons and hexagons, and is $C_{60}$ to $C_{90}$. More specifically, the fullerene is $C_{60}$.

In an exemplary embodiment of the present specification, the fullerene derivative is [6,6]-phenyl-$C_{61}$-butyric acid methyl ester ($PC_{61}BM$), [6,6]-phenyl-$C_{71}$-butyric acid methyl ester) ($PC_{71}BM$), phenyl-$C_{61}$-butyric acid cholesteryl ester (PCBCR), or 1',1'',4',4''-tetrahydro-di[1,4]methanonaphthaleno[1,2:2',3',56,60:2'',3''][5,6]fullerene-$C_{60}$ (ICBA).

In an exemplary embodiment of the present specification, the electron acceptor may also include an organic material, which is not fullerene series, such as 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC).

In an exemplary embodiment of the present specification, the single molecular material is a compound represented by the following Formula 1.

[Formula 1]

In Formula 1, n1 and n2 are each an integer from 1 to 3, when n1 and n2 are 2 or more, the structures in the parenthesis are the same as or different from each other, X1 to X7 are the same as or different from each other, and are each independently CRR', NR, O, SiRR', PR, S, GeRR', Se, or Te, and R1 to R8, R, and R' are the same as or different from each other, and are each independently hydrogen; deuterium; a halogen group; a nitrile group; a nitro group; a hydroxyl group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heterocyclic group.

In an exemplary embodiment of the present specification, R1 to R8 are the same as or different from each other, and are each independently hydrogen; a halogen group; a substituted or unsubstituted alkyl group; a substituted or unsubstituted aryl group; or a substituted or unsubstituted heterocyclic group.

In an exemplary embodiment of the present specification, R1 to R8 are the same as or different from each other, and are each independently hydrogen; a halogen group; or a substituted or unsubstituted alkyl group.

In an exemplary embodiment of the present specification, R1 and R2 are the same as or different from each other, and are each independently a substituted or unsubstituted alkyl group.

In an exemplary embodiment of the present specification, R1 and R2 are the same as or different from each other, and are each independently an alkyl group having 1 to 30 carbon atoms.

In an exemplary embodiment of the present specification, R1 and R2 are the same as or different from each other, and are each independently an alkyl group having 1 to 20 carbon atoms.

In an exemplary embodiment of the present specification, R1 and R2 are the same as or different from each other, and are each independently an alkyl group having 1 to 10 carbon atoms.

In an exemplary embodiment of the present specification, R3 and R4 are the same as or different from each other, and are each independently a halogen group.

In an exemplary embodiment of the present specification, R3 and R4 are each fluorine.

In an exemplary embodiment of the present specification, R5 to R8 are each hydrogen.

In an exemplary embodiment of the present specification, X1 to X7 are the same as or different from each other, and are each independently CRR', NR, O, SiRR', or S, and R and R' are the same as those described above.

In an exemplary embodiment of the present specification, X1 to X7 are the same as or different from each other, and are each independently SiRR' or S, and R and R' are the same as those described above.

In an exemplary embodiment of the present specification, X1 to X7 are the same as or different from each other, and are each independently SiRR' or S, and R and R' are a substituted or unsubstituted alkyl group.

In an exemplary embodiment of the present specification, X1 to X3 and X5 to X7 are S.

In an exemplary embodiment of the present specification, X4 is SiRR', and R and R' are a substituted or unsubstituted alkyl group.

In an exemplary embodiment of the present specification, X4 is SiRR', and R and R' are a straight-chained or branched alkyl group having 1 to 30 carbon atoms.

In an exemplary embodiment of the present specification, X4 is SiRR', and R and R' are a straight-chained or branched alkyl group having 1 to 20 carbon atoms.

In an exemplary embodiment of the present specification, n1 and n2 are 1.

In an exemplary embodiment of the present specification, n1 and n2 are 2.

In an exemplary embodiment of the present specification, n1 and n2 are 3.

In an exemplary embodiment of the present specification, the polymer material is a copolymer including a unit represented by the following Formula 2.

[Formula 2]

In Formula 2, l is a molar fraction, and a real number of $0<l\leq 1$, m is a molar fraction, and a real number of $0<m\leq 1$, l+m=1, h and i are each an integer from 1 to 3, when h and i are 2 or more, the structures in the parenthesis are the same as or different from each other, n is an integer from 1 to 10,000, a and b are each an integer from 1 to 5, X11 to X14 are the same as or different from each other, and are each independently CRR', NR, O, SiRR', PR, S, GeRR', Se, or Te, and R11 to R18, R, and R' are the same as or different from each other, and are each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; a substituted or unsubstituted fluorenyl group; a substituted or unsubstituted carbazole group; or a substituted or unsubstituted heterocyclic group.

According to an exemplary embodiment of the present specification, a number average molecular weight of the copolymer is 2,000 g/mol to 30,000,000 g/mol. Preferably, the number average molecular weight thereof is 10,000 g/mol to 3,000,000 g/mol. More preferably, the number average molecular weight thereof is 10,000 g/mol to 100,000 g/mol.

According to an exemplary embodiment of the present specification, the copolymer may have a molecular weight distribution of 1 to 100. Preferably, the copolymer has a molecular weight distribution of 1 to 3.

The lower the molecular weight distribution is and the larger the number average molecular weight is, the better electric characteristics and mechanical characteristics become, and it is preferred that the number average molecular weight of the copolymer is 100,000 g/mol or less, such that the copolymer has solubility at a certain level or more, and thus is advantageously applied to a solution application method.

In an exemplary embodiment of the present specification, R11 to R18 are the same as or different from each other, and are each independently hydrogen; a halogen group; a substituted or unsubstituted alkyl group; a substituted or unsubstituted alkoxy group; a substituted or unsubstituted aryl group; or a substituted or unsubstituted heterocyclic group.

In an exemplary embodiment of the present specification, R11 to R18 are the same as or different from each other, and are each independently hydrogen; a halogen group; a substituted or unsubstituted alkyl group; or a substituted or unsubstituted alkoxy group.

In an exemplary embodiment of the present specification, R11 to R14 are each hydrogen.

In an exemplary embodiment of the present specification, R15 and R16 are the same as or different from each other, and are each independently a halogen group.

In an exemplary embodiment of the present specification, R15 and R16 are each fluorine.

In an exemplary embodiment of the present specification, R17 and R18 are the same as or different from each other, and are each independently a substituted or unsubstituted alkoxy group.

In an exemplary embodiment of the present specification, X11 to X14 are the same as or different from each other, and are each independently CRR', NR, O, SiRR', or S, and R and R' are the same as those described above.

In an exemplary embodiment of the present specification, X11, X13, and X14 are each S.

In an exemplary embodiment of the present specification, X12 is NR, and R is a substituted or unsubstituted alkyl group.

In an exemplary embodiment of the present specification, X12 is NR, and R is an alkyl group having 1 to 30 carbon atoms.

In an exemplary embodiment of the present specification, X12 is NR, and R is an alkyl group having 1 to 20 carbon atoms.

In an exemplary embodiment of the present specification, l:m is 0.2:0.8 to 0.8:0.2.

In an exemplary embodiment of the present specification, l:m is 0.4:0.6 to 0.6:0.4.

In an exemplary embodiment of the present specification, l and m are each 0.5.

In an exemplary embodiment of the present specification, h and i are 1.

In an exemplary embodiment of the present specification, n is an integer from 2 to 10,000.

In an exemplary embodiment of the present specification, a is 1.

In an exemplary embodiment of the present specification, b is 1.

In an exemplary embodiment of the present specification, an end group of the copolymer is selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group.

In an exemplary embodiment of the present specification, the end group of the copolymer is a substituted or unsubstituted aryl group; or a substituted or unsubstituted heterocyclic group.

In an exemplary embodiment of the present specification, the end group of the copolymer is a 4-(trifluoromethyl)phenyl group.

An exemplary embodiment of the present specification provides an organic solar cell including: a first electrode; a second electrode provided to face the first electrode; and an organic material layer having one or more layers provided between the first electrode and the second electrode and including the above-described photoactive layer.

In an exemplary embodiment of the present specification, the organic solar cell may further include an additional organic material layer. The organic solar cell may reduce the number of organic material layers by using an organic material which simultaneously has various functions.

In an exemplary embodiment of the present specification, the organic solar cell includes a first electrode, a photoactive layer, and a second electrode. The organic solar cell may further include a substrate, a hole transport layer, and/or an electron transport layer.

In an exemplary embodiment of the present specification, the photoactive layer includes the single molecular material and the polymer material.

In an exemplary embodiment of the present specification, the organic material layer further includes a hole transport layer, a hole injection layer, or a layer which simultaneously transports and injects holes.

In another exemplary embodiment, the organic material layer further includes an electron injection layer, an electron transport layer, or a layer which simultaneously injects and transports electrons.

In an exemplary embodiment of the present specification, when the organic solar cell accepts a photon from an external light source, an electron and a hole are generated between an electron donor and an electron acceptor. The generated hole is transported to a positive electrode through an electron donor.

In an exemplary embodiment of the present specification, the first electrode is a positive electrode, and the second electrode is a negative electrode. In another exemplary embodiment of the present specification, the first electrode is a negative electrode, and the second electrode is a positive electrode.

In an exemplary embodiment of the present specification, an organic solar cell may be arranged in an order of a first electrode, a photoactive layer, and a second electrode based on a light source, and may be arranged in an order of a second electrode, a photoactive layer, and a first electrode based on a light source, but the arrangement order is not limited thereto.

In another exemplary embodiment, in the organic solar cell, a positive electrode, a hole transport layer, a photoactive layer, an electron transport layer, and a negative electrode may also be arranged in this order, and a negative electrode, an electron transport layer, a photoactive layer, a hole transport layer, and a positive electrode may also be arranged in this order, but the arrangement order is not limited thereto.

In an exemplary embodiment of the present specification, the electron donor and the electron acceptor constitute a bulk heterojunction (BHJ).

In the present specification, the substrate may be a glass substrate or a transparent plastic substrate having excellent transparency, surface smoothness, ease of handling, and waterproofing properties, but is not limited thereto, and the substrate is not limited as long as the substrate is typically used in the organic solar cell. Specific examples thereof include glass or polyethylene terephthalate (PET), polyethylene naphthalate (PEN), polypropylene (PP), polyimide (PI), triacetyl cellulose (TAC), and the like, but are not limited thereto.

The first electrode may be a material which is transparent and has excellent conductivity, but is not limited thereto. Examples thereof include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or SnO$_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

A method of forming the first electrode is not particularly limited, but the first electrode may be formed, for example, by being applied onto one surface of a substrate using a method such as sputtering, e-beam, thermal deposition, spin coating, screen printing, inkjet printing, doctor blade, or gravure printing, or by being coated in the form of a film.

When the first electrode is formed on a substrate, the first electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100° C. to 150° C. for 1 to 30 minutes, preferably at 120° C. for 10 minutes in order to remove moisture, and when the substrate is completely cleaned, the surface of the substrate is hydrophilically modified.

Through the surface modification as described above, the junction surface potential may be maintained at a level suitable for a surface potential of a photoactive layer. Further, during the modification, a polymer thin film may be easily formed on the first electrode, and the quality of the thin film may also be improved.

Examples of a pre-treatment technology for the first electrode include a) a surface oxidation method using a parallel flat plate-type discharge, b) a method of oxidizing the surface through ozone produced by using UV rays in a vacuum state, c) an oxidation method using oxygen radicals produced by plasma, and the like.

One of the methods may be selected according to the state of the first electrode or the substrate. However, although any method is used, it is preferred to commonly prevent oxygen from being separated from the surface of the first electrode or the substrate, and maximally inhibit moisture and organic materials from remaining. In this case, it is possible to maximize a substantial effect of the pre-treatment.

As a specific example, it is possible to use a method of oxidizing the surface through ozone produced by using UV. In this case, a patterned ITO substrate after being ultrasonically cleaned is baked on a hot plate and dried well, and then introduced into a chamber, and the patterned ITO substrate may be cleaned by ozone generated by allowing an oxygen gas to react with UV light by operating a UV lamp.

However, the surface modification method of the patterned ITO substrate in the present specification need not be particularly limited, and any method may be used as long as the method is a method of oxidizing a substrate.

The second electrode may be a metal having a low work function, but is not limited thereto. Specific examples thereof include: a metal such as magnesium, calcium, sodium, potassium, titanium, indium, yttrium, lithium, gadolinium, aluminum, silver, tin, and lead, or an alloy thereof; and a multi-layer structured material, such as LiF/Al, LiO$_2$/Al, LiF/Fe, Al:Li, Al:BaF$_2$, and Al:BaF$_2$:Ba, but are not limited thereto.

The second electrode may be deposited and formed in a thermal evaporator showing a vacuum degree of 5×10$^{-7}$ torr or less, but the forming method is not limited to this method.

A material for the hole transport layer and/or a material for the electron transport layer serve to efficiently transfer electrons and holes separated from a photoactive layer to an electrode, and the materials are not particularly limited.

The material for the hole transport layer may be poly(3,4-ethylenedioxythiophene) doped with poly(styrenesulfonic acid) (PEDOT:PSS) and molybdenum oxide (MoO$_x$); vanadium oxide (V$_2$O$_5$); nickel oxide (NiO); tungsten oxide (WO$_x$); and the like, but is not limited thereto.

The material for the electron transport layer may be electron-extracting metal oxides, and specific examples thereof include: metal complexes of 8-hydroxyquinoline; complexes including Alq$_3$; metal complexes including Liq; LiF; Ca; titanium oxide (TiO$_x$); zinc oxide (ZnO); cesium carbonate (Cs$_2$CO$_3$); and the like, but are not limited thereto.

The photoactive layer may be formed by dissolving a photoactive material such as an electron donor and/or an electron acceptor in an organic solvent, and then applying the solution by a method such as spin coating, dip coating, screen printing, spray coating, doctor blade, and brush painting, but the forming method is not limited thereto.

MODE FOR INVENTION

A preparation method of the photoactive layer and the manufacture of an organic solar cell including the same will be described in detail in the following Preparation Examples and Examples. However, the following Examples are provided for exemplifying the present specification, and the scope of the present specification is not limited thereby.

Preparation Example 1. Polymerization of Polymer 13 ml of chlorobenzene, 2,5-bis(trimethylstannyl)thiophene (1.2 g, 2.92 mmol), 5,8-dibromo-2,3-bis(3-(octyloxy)phenyl)quinoxaline (0.9905 g, 1.46 mmol), 1,3-dibromo-5-dodecylthieno[3,4-c]pyrrole-4,6-dione (0.7018 g, 1.46 mmol), tris(dibenzylideneacetone)dipalladium(0) ($Pd_2(dba)_3$, 80 mg), and tri-(o-tolyl)phosphine (106 mg) were put into a microwave reactor vial, and allowed to react under a condition of 170° C. for 1 hour. After the mixture was cooled to room temperature and poured into methanol, the solid was filtered and subjected to soxhlet extraction in methanol, acetone, hexane, and chloroform, and then the chloroform part was precipitated again in methanol and the solid was filtered out.

Figure 1:
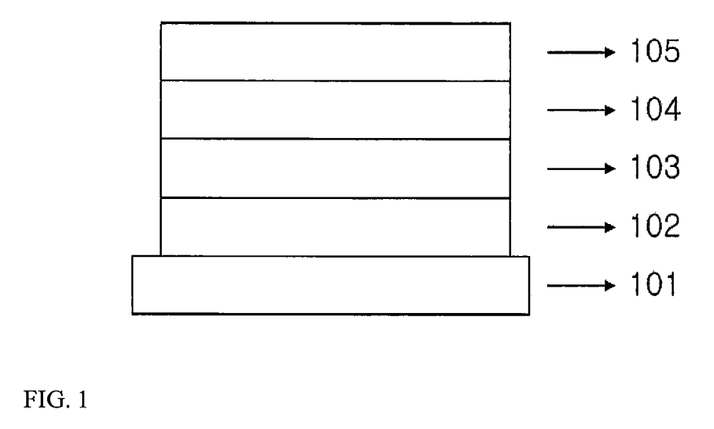
FIG. 1 is a view illustrating an organic solar cell according to an exemplary embodiment of the present specification.
Figure 2:
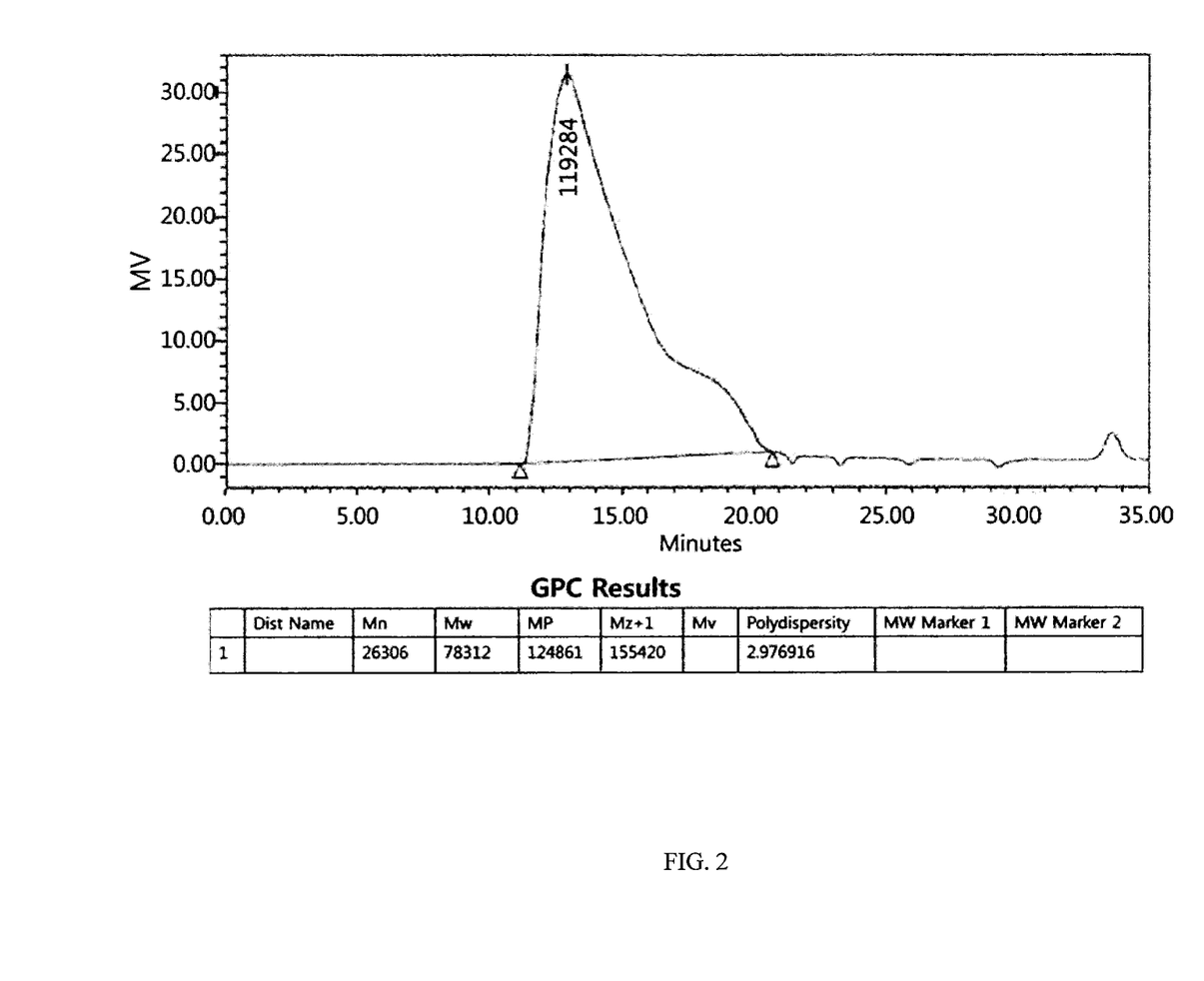
FIG. 2 is a view illustrating gel permeation chromatography (GPC) for a prepared polymer.

Yield: 60%
Number average molecular weight: 26,300 g/mol
Weight average molecular weight: 78,300 g/mol FIG. 2 is a view illustrating gel permeation chromatography (GPC) for the prepared polymer.

Manufacture of Organic Solar Cell and Measurement of Characteristics Thereof Example 1.

First and second composite solutions were prepared by dissolving each of a single molecule (p-DTS(FBTTH$_2$)$_2$, 1-Material Co., Ltd.) having the following structure and the polymer prepared in the Preparation Example with PC$_{71}$BM at a weight ratio of 3:2 in chlorobenzene (CB) at a concentration of 2.0 wt %. The first and second composite solutions were mixed at a ratio of 2.85:0.15, thereby preparing a third composite solution such that the weight ratio of the single molecule:the polymer:PCBM as a whole was 2.85:0.15:2. In this case, an organic solar cell was made to have a structure of ITO/ZnO/a photoactive layer/MoO$_3$/Ag. A glass substrate coated with ITO was ultrasonically washed using distilled water, acetone, and 2-propanol, and the ITO surface was treated with ozone for 10 minutes, followed by a spin-coating ZnO and a heat treatment at 230° C. for 1 hour. The third composite solution was filtered with a 0.45 μm PP syringe filter in order to coat the photoactive layer, and then spin-coated, MoO$_3$ was deposited by using a thermal evaporator under high vacuum, and Ag was deposited to a thickness of 100 nm thereon, thereby manufacturing an organic solar cell.

Example 2

After first and second composite solutions were prepared by dissolving each of a single molecule (p-DTS(FBTTH$_2$)$_2$, 1-Material Co., Ltd.) and the polymer prepared in the Preparation Example with PCBM at a weight ratio of 3:2 in chlorobenzene (CB) at a concentration of 2.0 wt %, the first and second composite solutions were mixed such that the weight ratio of the single molecule:the polymer:PCBM was 2.70:0.30:2, thereby preparing a fourth composite solution. An organic solar cell was manufactured in the same manner as in Example 1, except that the fourth composite solution was applied to the photoactive layer.

Comparative Example 1

A composite solution was prepared by dissolving a single molecule (p-DTS(FBTTH$_2$)$_2$, 1-Material Co., Ltd.) and PCBM at a weight ratio of 3:2 in chlorobenzene (CB). An organic solar cell was manufactured in the same manner as in Example 1, except that the composite solution was applied to the photoactive layer.

Comparative Example 2

A composite solution was prepared by dissolving the polymer and PCBM at a weight ratio of 1:2 in chlorobenzene (CB). An organic solar cell was manufactured in the same manner as in Example 1, except that the composite solution was applied to the photoactive layer.

Comparative Example 3

After first and second composite solutions were prepared by dissolving each of a single molecule (p-DTS(FBTTH$_2$)$_2$, 1-Material Co., Ltd.) and the polymer prepared in the Preparation Example with PCBM at a weight ratio of 3:2 in chlorobenzene (CB) at a concentration of 2.0 wt %, the first and second composite solutions were mixed such that the weight ratio of the single molecule:the polymer:PCBM was 0.15:2.85:2, thereby preparing a fifth composite solution. An organic solar cell was manufactured in the same manner as in Example 1, except that the fifth composite solution was applied to the photoactive layer.

Photoelectric conversion characteristics of the organic solar cells manufactured in Examples 1 and 2 and Comparative Examples 1 to 3 were measured under conditions (1SUN conditions) of 100 mV/cm$^2$ (AM 1.5), and the results thereof are shown in the following Table 1.

TABLE 1

| | Photoactive layer (Weight ratio of single molecule:polymer:electron acceptor) | PCE (%) |
|---|---|---|
| Example 1 | 2.85:0.15:2 | 6.75 |
| Example 2 | 2.70:0.30:2 | 6.36 |
| Comparative Example 1 | 3:0:2 | 5.11 |
| Comparative Example 2 | 0:1:2 | 4.75 |
| Comparative Example 3 | 0.15:2.85:2 | 1.98 |

In Table 1, the PCE means an energy conversion efficiency, and a higher value is preferred.

Figure 3:
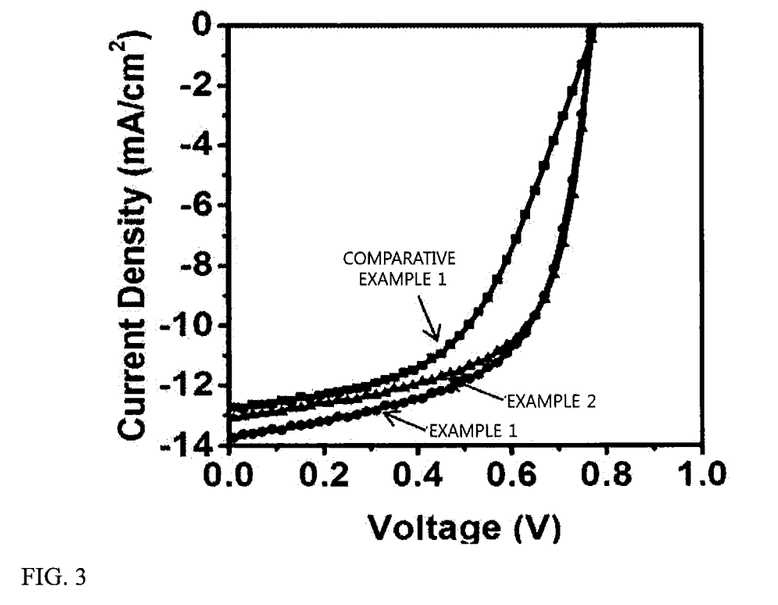
FIG. 3 is a view illustrating current-voltage curves of the organic solar cells prepared in the Examples and the Comparative Example of the present specification.

FIG. 3 is a view illustrating current-voltage curves of the organic solar cells prepared in the Examples and the Comparative Example of the present specification.

With respect to the organic solar cells manufactured in the Examples and the Comparative Examples, the changes in efficiency over time under the 1SUN conditions were measured and normalized, and the results thereof are shown in the following Table 2.

TABLE 2

| Time (h) | Example 1 | Example 2 | Comparative Example 1 |
|---|---|---|---|
| 0 | 1 | 1 | 1 |
| 18.5 | 0.51 | 0.59 | 0.43 |
| 43.5 | 0.34 | 0.45 | 0.29 |
| 78.5 | 0.22 | 0.36 | 0.14 |
| 267 | 0.12 | 0.18 | 0.03 |
| 1142 | 0.10 | 0.17 | 0.02 |

Figure 4:
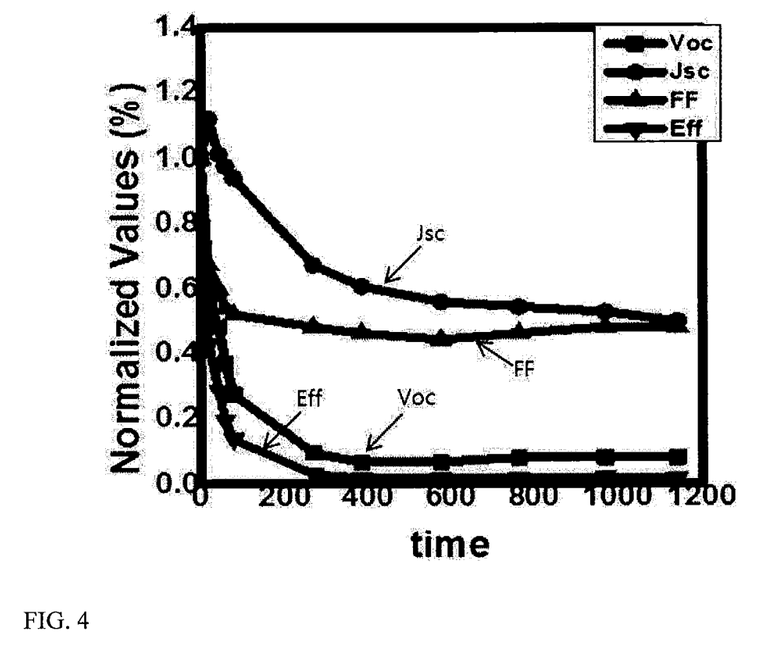
FIG. 4 is a view illustrating the changes in $V_{OC}$, $J_{SC}$, FF, and efficiency over time with respect to the organic solar cell prepared in Comparative Example 1 of the present specification.

FIG. 4 is a view illustrating the changes in $V_{OC}$, $J_{SC}$, FF, and efficiency over time with respect to the organic solar cell prepared in Comparative Example 1 of the present specification. In this case, $V_{oc}$, $J_{sc}$, and FF mean an open-circuit voltage, a short-circuit current, and a fill factor, respectively.

Figure 5:
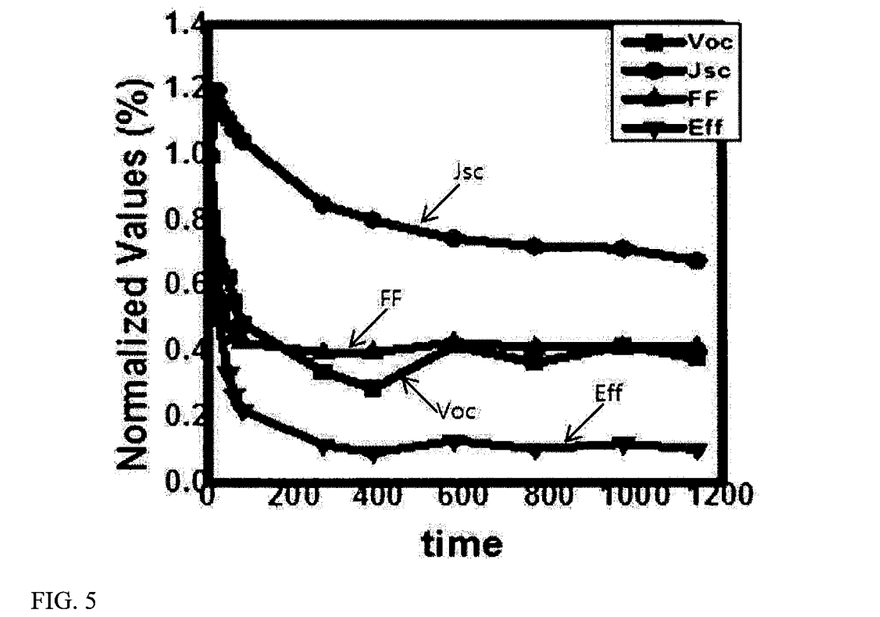
FIG. 5 is a view illustrating the changes in $V_{OC}$, $J_{SC}$, FF, and efficiency over time with respect to the organic solar cell prepared in Example 1 of the present specification.

FIG. 5 is a view illustrating the changes in $V_{OC}$, $J_{SC}$, FF, and efficiency over time with respect to the organic solar cell prepared in Example 1 of the present specification.

Figure 6:
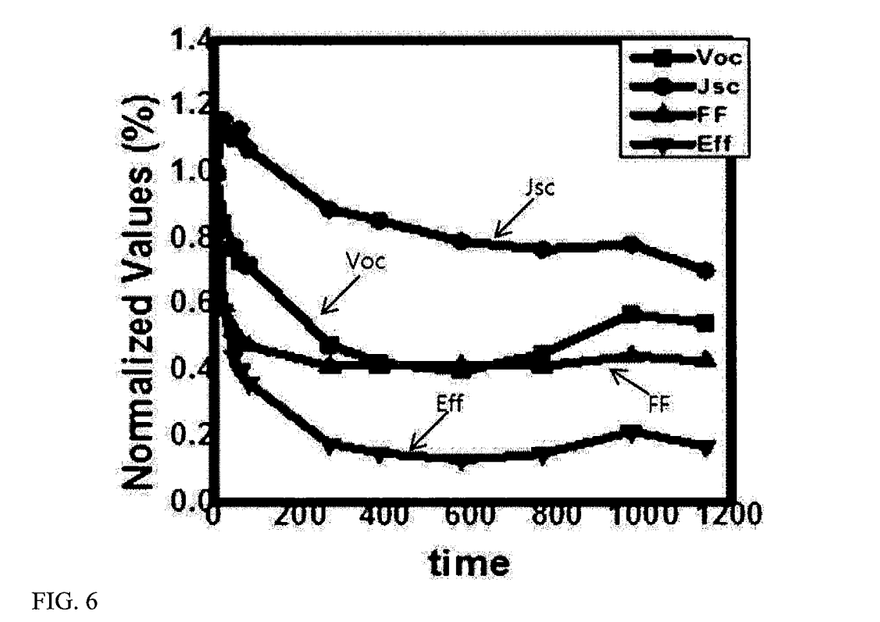
FIG. 6 is a view illustrating the changes in $V_{OC}$, $J_{SC}$, FF, and efficiency over time with respect to the organic solar cell prepared in Example 2 of the present specification.

FIG. 6 is a view illustrating the changes in $V_{OC}$, $J_{SC}$, FF, and efficiency over time with respect to the organic solar cell prepared in Example 2 of the present specification.

From the measurement results, it can be confirmed that when the single molecule and the polymer are simultaneously included as an electron donor, the efficiency and stability are excellent as compared to the case where only the single molecule or the polymer is included.

What is claimed is:

1. A photoactive layer comprising:
an electron donor; and
an electron acceptor,
wherein the electron donor comprises: a single molecular material and a polymer material,
a content of the electron donor is higher than a content of the electron acceptor, and
in the electron donor, a content of the single molecular material is higher than a content of the polymer material,
wherein the polymer material is a copolymer comprising a unit of Formula 2:

[Formula 2]

wherein:
L is a molar fraction, and a real number of 0<L<1;
m is a molar fraction, and a real number of 0<m<1;
L+m=1;
h is an integer from 1 to 3,
i is an integer from 1 to 3,
n is an integer from 1 to 10,000;
a and b are each an integer from 1 to 5;
X11 to X14 are the same as or different from each other, and are each independently CRR', NR, O, SiRR', PR, S, GeRR', Se, or Te; and
R11 to R18, R, and R' are the same as or different from each other, and are each independently hydrogen, deuterium, a halogen group, a nitrile group, a nitro group, an imide group, an amide group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted alkylamine group, a substituted or unsubstituted aralkylamine group, a substituted or unsubstituted arylamine group, a substituted or unsubstituted heteroarylamine group, a substituted or unsubstituted aryl group, a substituted or unsubstituted fluorenyl group, a substituted or unsubstituted carbazole group, or a substituted or unsubstituted heterocyclic group.

2. The photoactive layer of claim 1, wherein a weight ratio of the electron donor to the electron acceptor is 10:1 to 1.1:1.

3. The photoactive layer of claim 1, wherein a weight ratio of the single molecular material to the polymer material in the electron donor is 30:1 to 2:1.

4. The photoactive layer of claim 1, wherein the electron acceptor comprises a fullerene derivative.

5. The photoactive layer of claim 1, wherein the single molecular material is a compound of Formula 1:

[Formula 1]

wherein:

n1 is an integer from 1 to 3, n2 is an integer from 1 to 3,

X1 to X7 are the same as or different from each other, and are each independently CRR', NR, O, SiRR', PR, S, GeRR', Se, or Te; and R1 to R8, R, and R' are the same as or different from each other, and are each independently hydrogen, deuterium, a halogen group, a nitrile group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, or a substituted or unsubstituted heterocyclic group.

6. An organic solar cell comprising:

a first electrode;

a second electrode facing the first electrode; and an organic material layer comprising one or more layers provided between the first electrode and the second electrode, wherein the one or more layers comprise the photoactive layer according to claim 1.

7. The organic solar cell of claim 6, wherein the organic material layer further comprises a hole transport layer, a hole injection layer, or a layer which simultaneously transports and injects holes.

8. The organic solar cell of claim 6, wherein the organic material layer further comprises an electron injection layer, an electron transport layer, or a layer which simultaneously injects and transports electrons.

9. The photoactive layer of claim 1, wherein the polymer material has a number average molecular weight of 2,000 g/mol to 30,000,000 g/mol.

10. The photoactive layer of claim 1, wherein the single molecular material has a molecular weight of 1,000 g/mol to 10,000,000 g/mol.

11. The photoactive layer of claim 1, wherein the copolymer has a number average molecular weight of 10,000 g/mol to 100,000 g/mol.

12. The photoactive layer of claim 1, wherein the copolymer has a molecular weight distribution of 1 to 3.

13. The photoactive layer of claim 1, wherein R11 to R18 are the same as or different from each other, and are each independently hydrogen, a halogen group, a substituted or unsubstituted alkyl group, a substituted or unsubstituted alkoxy group, a substituted or unsubstituted aryl group, or a substituted or unsubstituted heterocyclic group.

14. The photoactive layer of claim 1, wherein R11 to R14 are each hydrogen, and wherein X11, X13, and X14 are each S.

15. The photoactive layer of claim 1, wherein R15 and R16 are the same as or different from each other, and are each independently a halogen group.

16. The photoactive layer of claim 1, wherein R17 and R18 are the same as or different from each other, and are each independently a substituted or unsubstituted alkoxy group.

17. The photoactive layer of claim 1, wherein X12 is NR, and R is a substituted or unsubstituted alkyl group.

* * * * *